(12) United States Patent
Ploessl et al.

(10) Patent No.: US 7,598,529 B2
(45) Date of Patent: Oct. 6, 2009

(54) SEMICONDUCTOR CHIP HAVING A SOLDERING LAYER SEQUENCE, AND PROCESS FOR SOLDERING A SEMICONDUCTOR CHIP

(75) Inventors: Andreas Ploessl, Regensburg (DE); Stefan Illek, Donaustauf (DE); Vincent Grolier, Regensburg (DE)

(73) Assignee: Osram Opto Semiconductors GmbH, Regensburg (DE)

(*) Notice: Subject to any disclaimer, the term of this patent is extended or adjusted under 35 U.S.C. 154(b) by 205 days.

(21) Appl. No.: 11/393,533

(22) Filed: Mar. 30, 2006

(65) Prior Publication Data

US 2006/0234482 A1 Oct. 19, 2006

(30) Foreign Application Priority Data

Mar. 31, 2005 (DE) .............. 10 2005 015 147
Jun. 23, 2005 (DE) .............. 10 2005 029 246

(51) Int. Cl.
*H01L 29/201* (2006.01)
(52) U.S. Cl. .................. 257/90; 257/E21.053
(58) Field of Classification Search ............ 438/119, 438/781–784; 228/124.1; 257/E21.51, 40, 257/79–104, E31.099, E31.105, E29.327, 257/E21.053
See application file for complete search history.

(56) References Cited

U.S. PATENT DOCUMENTS

| 4,817,854 | A | * | 4/1989 | Tihanyi et al. ........ 228/124.1 |
| 5,197,654 | A | | 3/1993 | Katz et al. |
| 5,877,086 | A | * | 3/1999 | Aruga ................... 438/653 |
| 5,990,560 | A | | 11/1999 | Coult et al. |
| 2003/0137058 | A1 | * | 7/2003 | Magerlein et al. ........ 257/784 |
| 2004/0256632 | A1 | | 12/2004 | Stein et al. |

FOREIGN PATENT DOCUMENTS

| DE | 1 614 668 | | 10/1970 |
| DE | 103 50 707 A1 | | 11/2004 |
| DE | 10329364 A1 | * | 2/2005 |
| GB | 1 207 010 | | 9/1970 |

OTHER PUBLICATIONS

I. Schnitzer, et al., "30% external quantum efficiency from surface textured, thin-film light-emitting diodes", Appl. Phys. Lett. vol. 63, No. 16, pp. 2174-2176, Oct. 18, 1993.

* cited by examiner

*Primary Examiner*—Brook Kebede
(74) *Attorney, Agent, or Firm*—Cohen Pontani Lieberman & Pavane LLP

(57) ABSTRACT

A semiconductor chip (1), to which a layer sequence (2) intended for the production of a soldered connection has been applied. The layer sequence (2) comprises a solder layer (15) and an oxidation prevention layer (17), which follows the solder layer (15) as seen from the semiconductor chip (1). A barrier layer (16) is included between the solder layer (15) and the oxidation prevention layer (17). This prevents a constituent of the solder layer (15) from diffusing through the oxidation prevention layer (17) prior to the soldering operation, where it would effect oxidation that is disadvantageous for producing a soldered connection.

29 Claims, 2 Drawing Sheets

SEMICONDUCTOR CHIP HAVING A SOLDERING LAYER SEQUENCE, AND PROCESS FOR SOLDERING A SEMICONDUCTOR CHIP

RELATED APPLICATION

This patent application claims the priority of German patent applications 10 2005 015 147 7 filed Mar. 31, 2005 and 10 2005 029 246.1 filed Jun. 23, 2005, the disclosure content of which is hereby incorporated by reference.

FIELD OF THE INVENTION

The invention relates to a semiconductor chip having a soldering layer sequence which is intended to produce a soldered connection, and to a process for soldering a semiconductor chip.

BACKGROUND OF THE INVENTION

Low-melting metals which are used as solder or solder constituents are generally very prone to oxidation. Therefore, when producing joining connections by means of a solder which contains a low-melting metal, the formation of oxide at the surface of the solder layer often impedes complete wetting of one of the joining partners. Open, so-called cold soldering locations or soldered connections which are only connected at a few points may ensue. The formation of oxide can be reduced by soldering under a shielding gas or a reducing atmosphere. However, this entails increased production costs. Furthermore, the oxidation can also be reduced by using flux. However, this is often not practicable or desirable in particular in the case of thin soldered connections or large-area joins.

Document DE 103 50 707 describes an electrical contact for an optoelectronic semiconductor chip, in which a metal layer on the semiconductor surface produces an electrical metal/semiconductor contact. To avoid diffusion of constituents of the solder layer into the metal layer applied to the semiconductor surface, which preferably acts as a mirror for the radiation emitted from the semiconductor chip, a barrier layer, for example a barrier layer of TiWN, is included between the solder layer and the metal layer.

The problem often also exists that solder layers have poor adhesion to a barrier layer of this type. Furthermore, solder layers often also have poor adhesion to metallic carriers. The reason for this is the poor wettability of the barrier layers and/or the surface of the carrier. For this reason, a layer with good wetting properties, for example a wetting layer of platinum is introduced between the barrier layer and the solder layer or between the carrier surface and the solder. In this case, however, there is a risk of the material of the wetting layer, in particular platinum, reacting at least slightly with the solder. In the case of thin solder layers, this can disadvantageously alter the stoichiometry of the solder.

Furthermore, it is known from document DE 103 50 707 to protect the solder layer from oxidation by applying a thin layer of gold.

With some solder metals, however, there is a risk of solder constituents, in particular low-melting metals, diffusing through an oxidation prevention layer of this type even at low temperatures, for example even at room temperature, thereby reducing the protective effect. If the thickness of the protective layer were to be significantly increased, in order to prevent diffusion of a solder constituent toward the surface of the oxidation prevention layer, the thickness of the solder layer would also have to be increased accordingly if the composition of the solder is not to be significantly altered by the protective layer following the melting process. However, in particular for the soldering of semiconductor chips, for example for soldering LED chips in an LED housing, low solder thicknesses are generally required in order to minimize the overall height of the component and to rule out the risk of short circuits at the edge of the chip.

SUMMARY OF THE INVENTION

One object of the present invention is to provide a semiconductor chip having an improved layer sequence which is intended for the production of a soldered connection and is distinguished in particular by improved protection of the solder layer from oxidation.

Another object is to provide an advantageous process for producing a soldered connection between a semiconductor chip and a carrier.

These and other objects are attained in accordance with one aspect of the present invention directed to a semiconductor chip to which a layer sequence intended to produce a soldered connection has been applied. The layer sequence comprises a solder layer and an oxidation prevention layer, which follows the solder layer as seen from the semiconductor chip. A barrier layer is included between the solder layer and the oxidation prevention layer.

The inclusion of a barrier layer between the solder layer and the oxidation prevention layer advantageously reduces diffusion of constituents of the solder layer toward the surface of the oxidation prevention layer which faces away from the solder layer. This in particular rules out the risk of constituents of the solder layer, prior to the soldering operation, passing through the oxidation prevention layer to the surface facing away from the solder layer as a result of diffusion, and thereby causing oxidation, which could otherwise have an adverse effect on the quality of a soldered connection.

The barrier layer preferably contains at least one of the metals Ti, V, Cr, Nb, Zr, Hf, Ta, Mo or W. These materials are particularly suitable as a diffusion barrier for low-melting metals.

The thickness of the barrier layer is advantageously such that it is impossible for any constituent of the solder layer which is susceptible to oxidation to reach the surface of the oxidation prevention layer prior to the soldering process. For this reason, the barrier layer preferably has a thickness of 5 nm or more, particularly preferably 10 nm or more.

On the other hand, however, the thickness of the barrier layer should also not be so great as to impede melting and fusion of the solder constituents during the soldering operation. The thickness of the barrier layer should also be as low as possible, because the stoichiometry of the solder is not to be significantly altered by the barrier layer, which also melts during the soldering operation. For this reason, the thickness of the barrier layer is advantageously 100 nm or less, particularly preferably 50 nm or less. A particularly preferred range for the thickness of the barrier layer is between 10 nm and 50 nm inclusive.

The solder layer contains, for example, a metal or a metal alloy, preferably Sn, In, Ga, Bi, Pb, Sb, Zn, Cd, Hg, Tl, AuSn, AuIn, AuBi, AgSn or PbSn. The solder layer may be either an individual layer or a layer stack comprising a plurality of layers. By way of example, the solder layer may comprise a multiplicity of alternating Au layers and Sn layers which fuse to form an AuSn alloy during the soldering operation.

The thickness of the solder layer is advantageously 3 μm or less, particularly preferably 2 μm or less. Such a low thickness of the solder layer is advantageous in order to minimize the overall height of a component which includes a semiconductor chip according to the invention. Furthermore, with a relatively thin solder layer, there is a reduced risk of part of the solder reaching the edge of the chip, where it causes a short circuit. Furthermore, a relatively thin solder layer is advantageous because the risk of tilting of the chip during soldering mounting and the difficulty of positioning adjacent chips at the same height are reduced. Moreover, the production costs are relatively low for a comparatively thin solder layer.

The oxidation prevention layer advantageously consists of a material which is relatively unsusceptible to oxidation. The oxidation prevention layer is preferably formed from a metal that is relatively unsusceptible to oxidation, for example from Au, Pt, Pd, Ir, Ag or Rh.

In one embodiment of the invention, the oxidation prevention layer is formed from a metal that is relatively unsusceptible to oxidation and is a constituent of the solder layer. This has the advantage that during the melting which forms part of the soldering operation, the oxidation prevention layer forms an alloy with the solder layer. By way of example, the solder layer may contain AuSn and the oxidation prevention layer may be an Au layer.

The thickness of the oxidation prevention layer is advantageously between 50 nm and 200 nm inclusive. The thickness of the oxidation prevention layer is in this case sufficiently low to cause only a relatively slight change in the stoichiometry of the solder layer during the melting and fusion with the oxidation prevention layer and the barrier layer.

In a further embodiment of the invention, a wetting layer is included between the semiconductor chip and the solder layer. A second barrier layer is advantageously arranged between the wetting layer and the solder layer. The wetting layer improves the wetting of a surface to which the solder layer is applied. This is advantageous in particular if the solder layer has been applied to a contact metallization of the semiconductor chip, which it is difficult for the solder layer to wet. The wetting layer is advantageous in particular also if a blocking layer that is difficult for the solder layer to wet is arranged between a contact metallization of the semiconductor chip and the solder layer. A blocking layer of this type is formed, for example, from TiWN and prevents the diffusion of solder constituents into the contact metallization. The wetting layer advantageously contains Pt, Ni, Pd, Au, Ag, Cu or Sn.

The second barrier layer advantageously prevents a reaction between the wetting layer and the solder layer or constituents of the solder layer. By way of example, depletion of a constituent of the solder layer, for example Sn, at the wetting layer, which consists for example of platinum, is reduced.

The second barrier layer advantageously contains at least one of the materials Ti, V, Cr, Nb, Zr, Hf, Ta, Mo or W. The thickness of the second barrier layer is preferably between 5 nm and 100 nm inclusive, particularly preferably between 10 nm and 50 nm inclusive.

The semiconductor chip is preferably an optoelectronic semiconductor chip, in particular a radiation-emitting optoelectronic semiconductor chip. The semiconductor chip preferably contains a III-V compound semiconductor material, in particular $In_xAl_yGa_{1-x-y}N$, $In_xAl_yGa_{1-x-y}P$ or $In_xAl_yGa_{1-x-y}As$, in each case where $0 \leq x \leq 1$, $0 \leq y \leq 1$ and $x+y \leq 1$. In this case, the III-V compound semiconductor material does not necessarily have to have a composition which is mathematically precisely in accordance with one of the above formulae. Rather, it may include one or more dopants and additional constituents which, however, do not significantly modify the physical properties of the material. For the sake of simplicity, however, the above formulae give only the main constituents of the crystal lattice, even though these constituents may be partially replaced by small quantities of further substances.

In a preferred embodiment, the semiconductor chip is a thin-film light-emitting diode chip. In the case of a thin-film light-emitting diode chip, a functional semiconductor layer sequence is first of all grown epitaxially on a growth substrate, and is then soldered to a new carrier at a surface of the semiconductor layer sequence which is on the opposite side from the growth substrate. In this embodiment of the invention, the soldering layer sequence is intended for soldering the thin-film light-emitting diode chip to the new carrier. The growth substrate can then be detached and advantageously reused.

A thin-film light-emitting diode chip is distinguished in particular by the following characteristic features:

a reflecting layer is applied to or formed on a first main surface, facing a carrier, of a radiation-generating epitaxy layer sequence, which reflecting layer reflects at least some of the electromagnetic radiation generated in the epitaxy layer sequence back into the latter;

the epitaxy layer sequence has a thickness in the range of 20 µm or less, in particular in the range of 10 µm; and the epitaxy layer sequence includes at least one semiconductor layer having at least one surface that has a mixing structure which ideally leads to an approximately ergodic distribution of the light in the epitaxial layer sequence, i.e. it has a scattering behavior that is as far as possible ergodically stochastic.

A basic principle of a thin-film light-emitting diode chip is described, for example, in I. Schnitzer et al., Appl. Phys. Lett. 63 (16), Oct. 18, 1993, 2174-2176, the content of disclosure of which in this respect is hereby incorporated by reference.

In a process according to an embodiment of the invention for forming a soldered connection between a carrier and a semiconductor chip, in which either the semiconductor chip or the carrier is provided with a layer sequence that is intended to produce a soldered connection and comprises a solder layer and an oxidation prevention layer, which follows the solder layer as seen in a growth direction of the layer sequence, a barrier layer being included between the solder layer and the oxidation prevention layer, the solder layer melts during the soldering operation, with the barrier layer and the oxidation prevention layer mixing with the solder layer. The barrier layer and the oxidation prevention layer are therefore consumed by the solder layer during the soldering operation.

The melting of the solder layer is preferably effected by placing the semiconductor chip provided with the layer sequence onto a carrier surface that has been heated to the intended soldering temperature.

The barrier layer advantageously reduces diffusion of a material that is a constituent of the solder layer through the oxidation prevention layer at a temperature which is lower than the intended soldering temperature. In particular, the diffusion of a constituent of the solder layer, for example tin, during storage of the semiconductor chip prior to soldering mounting, for example at room temperature, is reduced. Furthermore, the diffusion is also delayed if the semiconductor chip is positioned above a heated soldering mounting surface prior to the soldering operation.

The advantageous configurations which have been described above in connection with the semiconductor chip according to the invention can also apply to the disclosed process in accordance with the invention.

DETAILED DESCRIPTION OF THE DRAWINGS

Identical or equivalent elements are denoted by the same reference designations in the figures.

Figure 1:
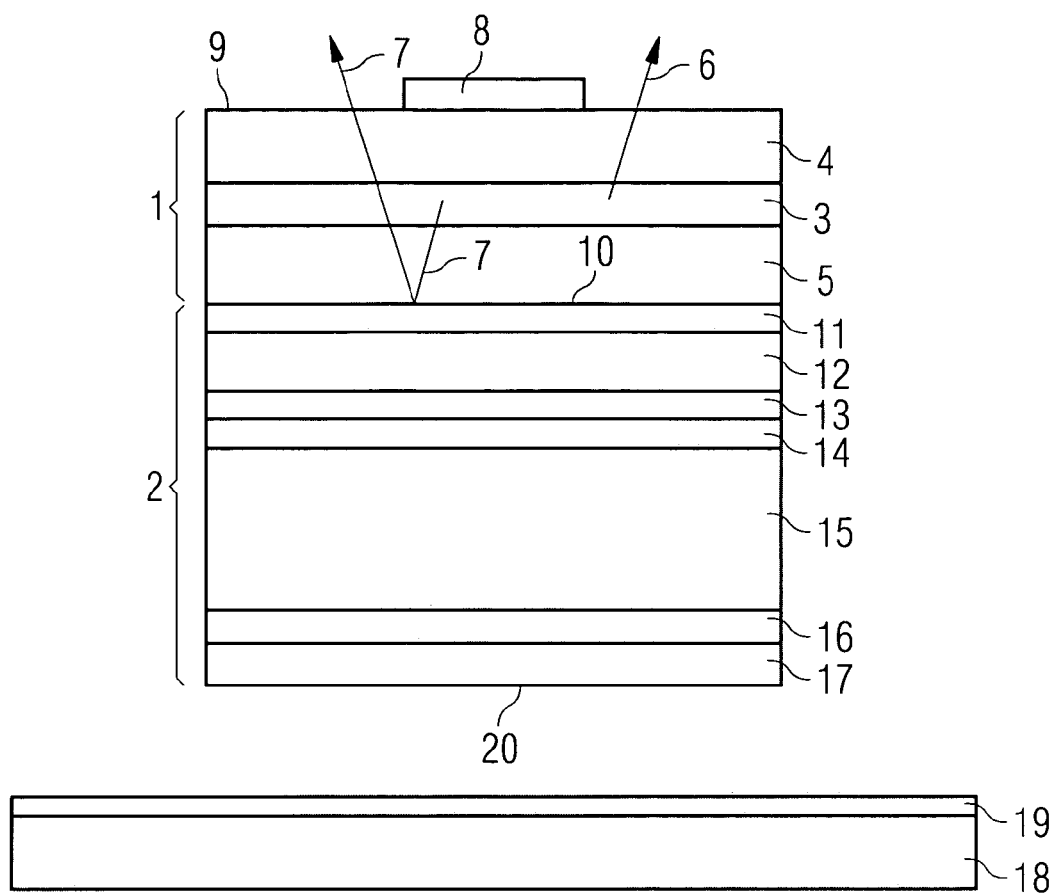
FIG. 1 diagrammatically depicts a cross section through a first exemplary embodiment of a semiconductor chip according to the invention, and FIG. 2 diagrammatically depicts a cross section through a second exemplary embodiment of a semiconductor chip according to the invention.

In the first exemplary embodiment of the invention, illustrated in FIG. 1, a layer sequence 2 which is intended to produce a soldered connection has been applied to a semiconductor chip 1. The semiconductor chip 1 is preferably an optoelectronic semiconductor chip, which in particular includes an active layer 3, which is intended for the generation of radiation 6, 7, and further semiconductor layers, for example a region of n-doped semiconductor layers 4 and a region of p-doped semiconductor layers 5. The semiconductor chip 1 has an edge length of, for example, approximately 1 mm or less. It is preferably less than 400 μm thick and, for example, it is approximately 190 μm thick.

The semiconductor chip 1 is electrically contact-connected by means of a first terminal contact 8, which has been applied to the front main surface 9, intended to release the radiation, of the semiconductor chip 1, and a second electrical terminal contact, which is, for example, a contact metallization 11 that has been applied to a rear main surface 10 of the semiconductor chip 1.

The layer sequence 2 comprises in particular a solder layer 15. The solder layer 15 is intended to secure the semiconductor chip 1 to a carrier 18. The solder layer 15 advantageously also produces an electrically conductive connection between the contact metallization 11 and an electrical terminal location on the carrier 18, for example an interconnect 19 that has been applied to the carrier 18.

The contact metallization 11 is preferably formed from a metal or a metal alloy, for example from aluminum, silver, gold or a gold/germanium alloy. It is particularly preferable for the contact metallization 11 to form an ohmic contact with the adjoining semiconductor layer 5.

In a preferred embodiment of the invention, the contact metallization 11 functions as a reflector for the radiation 7 emitted from the active layer 3 in the direction of the contact metallization 11. The radiation 7 is advantageously reflected at the rear main surface 10 of the semiconductor chip 1, adjoining the contact metallization 11, in the direction of the front main surface 9, at which it can emerge from the semiconductor chip 1. In this way, absorption of the radiation emitted by the active layer 3 in the layer sequence 2 is reduced, and thereby the efficiency with which light is generated is increased. To achieve a high reflectivity of the contact metallization 11, the material of the contact metallization 11, at the wavelength of the emitted radiation 6, 7, preferably has a relatively high difference in refractive index compared to the adjacent semiconductor layer 5. Materials which are particularly suitable for the contact metallization 11 include, for example, silver or aluminum.

A blocking layer 12 is advantageously included between the contact metallization 11 and the solder layer 15. The blocking layer 12 has the function of preventing diffusion of constituents of the solder layer 15 into the contact metallization 11. By way of example, the blocking layer is a TiWN layer, which advantageously has a thickness of between 300 nm and 500 nm inclusive.

In a preferred embodiment of the invention, a wetting layer 13 is included between the blocking layer 12 and the solder layer 15. This is advantageous in particular if the material of the blocking layer 12 cannot readily be wetted by the material of the solder layer 15. The wetting layer 10 is preferably a platinum layer.

The solder layer 15 preferably contains at least one of the materials tin, indium, gallium or bismuth. The thickness of the solder layer is advantageously 3 μm or less. By way of example, the solder layer 15 is a 2 μm thick Sn layer. A relatively low thickness of the solder layer in particular has the advantage of reducing the risk of constituents of the solder layer, for example Sn atoms, 15 reaching the side flanks of the semiconductor chip 1 during the soldering operation, where they could cause a short circuit of the semiconductor layers 3, 4, 5.

To protect the solder layer 15 from oxidation, the layer sequence 2 includes an oxidation prevention layer 17 on a side of the solder layer 15 which faces away from the semiconductor chip 1. The oxidation prevention layer 17 is preferably formed from a metal which is relatively unsusceptible to oxidation, preferably gold. The thickness of the oxidation prevention layer 17 is advantageously between 50 nm and 200 nm inclusive. By way of example, the oxidation prevention layer 17 is a 100 nm thick Au layer.

A barrier layer 16 is arranged between the solder layer 15 and the oxidation prevention layer 17. The barrier layer 16 preferably contains at least one of the materials titanium, vanadium, chromium or niobium. The thickness of the barrier layer 16 is advantageously between 5 nm and 100 nm inclusive, particularly preferably between 10 nm and 50 nm inclusive. With this type of thickness, the barrier layer is on the one hand thick enough to effectively reduce diffusion of a solder constituent into the oxidation prevention layer 17 and on the other hand is thin enough to only slightly modify the stoichiometry of the solder layer 15 during melting and fusion with the barrier layer 10 and the oxidation prevention layer 17.

The barrier layer 16, for example a 10 nm thick titanium layer, advantageously prevents diffusion of constituents of the solder layer, for example tin atoms, into the oxidation prevention layer 17. Otherwise, there would be a risk of constituents of the solder layer 15 diffusing to the surface 20 of the oxidation prevention layer 17, where they would lead to the formation of oxide. This could lead to open, so-called cold soldering locations or soldered connections which are connected at only a few points being formed.

The barrier layer 16 is advantageous in particular if, between application of the solder layer and soldering mounting of the semiconductor chip on a carrier 18, the semiconductor chip 1 is stored for such a length of time that without the barrier layer 16 diffusion of a solder constituent to the surface 20 of the oxidation prevention layer 17 could take place even at room temperature.

Furthermore, the barrier layer 16 is particularly advantageous if the semiconductor chip is exposed to further process steps, involving elevated temperatures which would promote diffusion of solder constituents, between the application of the solder layer 15 and the soldering mounting.

A second barrier layer 14 is advantageously included between the wetting layer 13 and the solder layer 15. The barrier layer 14 advantageously prevents a reaction between a constituent of the solder layer 15, for example tin, and the material of the wetting layer 13, for example platinum.

Like the barrier layer 16 which is arranged between the solder layer 15 and the oxidation prevention layer 17, the second barrier layer 14 contains at least one of the materials titanium, vanadium, chromium or niobium. The thickness of the second barrier layer is preferably between 5 nm and 100 nm inclusive, particularly preferably between 10 nm and 50 nm inclusive. The barrier layer 16 and the second barrier layer 14 may, for example, be made from the same material, thereby keeping production costs relatively low. By way of example, the barrier layer 16 is a 10 nm thick titanium layer, and the second barrier layer 14 is a 50 nm thick titanium layer.

The carrier 18 intended for the semiconductor chip 1 may in particular be a printed-circuit board or a leadframe. Furthermore, carrier 18 may be formed from a ceramic and be provided, for example, as a carrier for a plurality of semiconductor chips. Furthermore, the carrier 18 may also be an LED housing.

To produce a soldered connection between the carrier 18 and the semiconductor chip 1, by way of example the carrier 18 is heated to the temperature intended for the soldering operation, and the semiconductor chip 1, to which the layer sequence 2 which is intended for the production of the soldered connection has been applied, at the surface 20 of the oxidation prevention layer 17, is placed and preferably pressed onto the carrier 18 or onto a metallization 19 that has been applied to the carrier, for example an interconnect. The barrier layers 14, 16, the solder layer 15 and the oxidation prevention layer 17 melt during the soldering operation, with the respective materials of the barrier layer 16 and the second barrier layer 14 either forming an intermetallic compound with the material of the solder layer 15 or being distributed in some other form in the region of the soldered connection. Prior to the melting of the layers, for example during storage of the semiconductor chip 1 prior to soldering mounting or during positioning of the semiconductor chip 1 above the carrier 18 which has already been heated, diffusion of a constituent of the solder layer 15, in particular tin, to the surface of the oxidation prevention layer 17 is advantageously prevented by the barrier layer 16.

Figure 2:
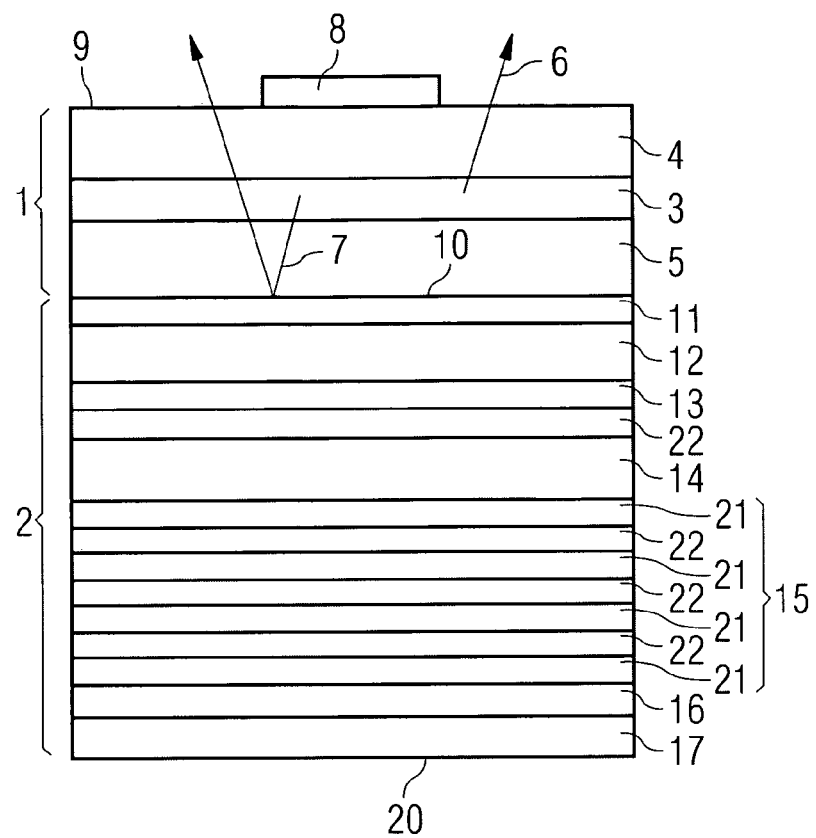
Figure 2:
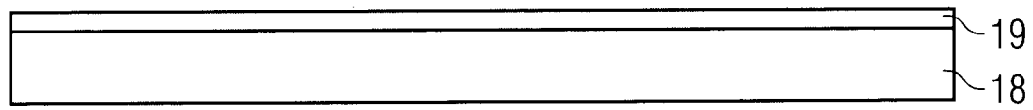

In the second exemplary embodiment of a semiconductor chip 1 according to the invention, which is illustrated in FIG. 2, the solder layer 15 is not a single layer, but rather is a layer stack comprising a multiplicity of tin layers 21 and gold layers 22. During the soldering operation, the tin layers 21 and the gold layers 22 fuse to form an AuSn alloy. As in the first exemplary embodiment, a barrier layer 16 is introduced between the solder layer 15, which is formed as a layer stack, and the oxidation prevention layer 17. By way of example, the barrier layer 16 may be a 20 nm thick vanadium layer.

As in the first exemplary embodiment, so too in the second exemplary embodiment a second barrier layer 14, for example a 50 nm thick titanium layer, is included between the wetting layer 13 and the solder layer 15. Unlike in the first exemplary embodiment, however, the second barrier layer 14 has not been applied direct to the wetting layer 13. Rather, first of all a gold layer 22, followed by the second barrier layer 14 and then a first tin layer 21 of the layer stack forming the solder layer 15, have been applied to that side of the wetting layer 13 which faces away from the blocking layer 12. Therefore, the second barrier layer 14 directly adjoins the tin layer 21. This is advantageous since a reaction between the material tin in the layer stack of the solder stack 15 and the material platinum in the wetting layer 13 needs to be suppressed. Otherwise, the second exemplary embodiment substantially corresponds to the first exemplary embodiment.

The layer sequence 2 does not have to be applied over the entire surface of the semiconductor chip 1, as illustrated in the two exemplary embodiments. Rather, the layer sequence 2 may also be patterned in any desired way, for example by means of photolithography or the lift-off technique. In particular, it is possible for both an n-type contact and a p-type contact to be arranged on that side of the semiconductor chip 1 which faces the carrier 18 and, for example, for both contacts to be connected by a soldered connection, using a layer sequence 2 as described above, to a respective interconnect on the carrier 18.

The invention is not restricted by the description with reference to the exemplary embodiments. Rather, the invention comprises any novel feature and any combination of features, which in particular includes any combination of features in the patent claims, even if this feature or combination is not explicitly indicated in the patent claims or exemplary embodiments.

We claim:

1. A semiconductor chip structure comprising:
   a semiconductor chip, and
   a layer sequence applied to the semiconductor chip for producing a soldered connection,
   wherein the layer sequence comprises a solder layer and an oxidation prevention layer, which is arranged on a side of the solder layer facing away from the semiconductor chip, and
   wherein a barrier layer is included between the solder layer and the oxidation prevention layer, the barrier layer having a thickness of at least 5 nm and less than 100 nm.

2. The semiconductor chip structure as claimed in claim 1, wherein the barrier layer reduces diffusion of a material that is a constituent of the solder layer through the oxidation prevention layer.

3. The semiconductor chip structure as claimed in claim 1, wherein the barrier layer comprises a material selected from the group consisting of Ti, V, Cr, Nb, Zr, Hf, Ta, Mo and W.

4. The semiconductor chip structure as claimed in claim 1, wherein the solder layer comprises a material selected from the group consisting of Sn, In, Ga, Bi, Pb, Sb, Zn, Cd, Hg, Tl, AuSn, AuIn, AuBi, AgSn and PbSn.

5. The semiconductor chip structure as claimed in claim 1, wherein the thickness of the solder layer is 3 µm or less.

6. The semiconductor chip structure as claimed in claim 1, wherein the oxidation prevention layer comprises a material selected from the group consisting of Au, Pt, Pd, Ir, Ag and Rh.

7. The semiconductor chip structure as claimed in claim 1, wherein the oxidation prevention layer is between 50 nm and 200 nm inclusive thick.

8. The semiconductor chip structure as claimed in claim 1, wherein a wetting layer is included between the semiconductor chip and the solder layer, a second baffler layer being arranged between the wetting layer and the solder layer.

9. The semiconductor chip structure as claimed in claim 8, wherein the second baffler layer comprises a material selected from the group consisting of Ti, V, Cr, Nb, Zr, Hf, Ta, Mo and W.

10. The semiconductor. chip. structure as claimed in claim 8, wherein the second baffler layer has a thickness of between 5 nm and 100 nm inclusive.

11. The semiconductor chip structure as claimed in claim 8, wherein the wetting layer comprises a material selected from the group consisting of Pt, Ni, Pd, Au, Ag, Cu and Sn.

12. The semiconductor chip structure as claimed in claim 1, wherein the semiconductor chip is an optoelectronic semiconductor chip.

13. The semiconductor chip structure as claimed in claim 12, wherein the semiconductor chip is a thin-film light-emitting diode chip.

14. The semiconductor chip structure as claimed in claim 1, wherein the thickness of the barrier layer is 50 nm or less.

15. A process for forming a soldered connection between a carrier and a semiconductor chip, the process comprising:
providing a layer sequence to one of the carrier and the semiconductor chip for producing the soldered connection, wherein the layer sequence comprises a solder layer and an oxidation prevention layer, which is arranged on a side of the solder layer facing away from the one of the carrier and the semiconductor chip, a barrier layer being included between the solder layer and the oxidation prevention layer, and
during the soldering operation, melting the solder layer and mixing the barrier layer and the oxidation prevention layer with the solder layer.

16. The process as claimed in claim 15, wherein the layer sequence is arranged on the semiconductor chip, and the melting is effected by placing the semiconductor chip onto a heated surface of the carrier.

17. The process as claimed in claim 15, wherein the barrier layer reduces diffusion of a material that is a constituent of the solder layer through the oxidation prevention layer at a temperature which is lower than the intended soldering temperature.

18. The process as claimed in claim 15, wherein the baffler layer comprises a material selected from the group consisting of Ti, V, Cr, Nb, Zr, Hf, Ta, Mo and W.

19. The process as claimed in claim 15, wherein the baffler layer has a thickness between 5 nm and 100 nm inclusive.

20. The process as claimed in claim 15, wherein the solder layer comprises a material selected from the group consisting of Sn, In, Ga, Bi, Pb, Sb, Zn, Cd, Hg, Tl, AuSn, AuIn, AuBi, AgSn and PbSn.

21. The process as claimed in claim 15, wherein the thickness of the solder layer is 3 µm or less.

22. The process as claimed in claim 15, wherein the oxidation prevention layer comprises a material selected from the group consisting of Au, Pt, Pd, Ir, Ag and Rh.

23. The process as claimed in claim 1.5, wherein the oxidation prevention layer is between 50 nm and 200 nm inclusive thick.

24. The process as claimed in claim 15, wherein a wetting layer is included between the one of the carrier and the semiconductor chip or the carrier body and the solder layer, a second barrier layer being arranged between the wetting layer and the solder layer.

25. The process as claimed in claim 24, wherein the second barrier layer comprises a material selected from the group consisting of Ti, V, Cr, Nb, Zr, Hf, Ta, Mo and W.

26. The process as claimed in claim 24, wherein the second barrier layer has a thickness of between 5 nm and 100 nm inclusive.

27. The process as claimed in claim 24, wherein the wetting layer comprises a material selected from the group consisting of Pt, Ni, Pd, Au, Ag, Cu and Sn.

28. The process as claimed in claim 15, wherein the semiconductor chip is an optoelectronic semiconductor chip.

29. The process as claimed in claim 28, wherein the semiconductor chip is a thin-film light-emitting diode chip.

* * * * *

UNITED STATES PATENT AND TRADEMARK OFFICE
CERTIFICATE OF CORRECTION

PATENT NO. : 7,598,529 B2
APPLICATION NO. : 11/393533
DATED : October 6, 2009
INVENTOR(S) : Andreas Ploessl et al.

It is certified that error appears in the above-identified patent and that said Letters Patent is hereby corrected as shown below:

Column 8, lines 51-54, should read as follows:

--8. The semiconductor chip structure as claimed in claim 1, wherein a wetting layer is included between the semiconductor chip and the solder layer, a second ~~baffler~~ <u>barrier</u> layer being arranged between the wetting layer and the solder layer.--

Column 8, lines 55-58, should read as follows:

--9. The semiconductor chip structure as claimed in claim 8, wherein the second ~~baffler~~ <u>barrier</u> layer comprises a material selected from the group consisting of Ti, V, Cr, Nb, Zr, Hf, Ta, Mo and W.--

Column 8, lines 59-64, should read as follows:

--10. The semiconductor chip structure as claimed in claim 8, wherein the second ~~baffler~~ <u>barrier</u> layer has a thickness of between 5 nm and 100 nm inclusive.--

Column 9, lines 28-30, should read as follows:

--18. The process as claimed in claim 15, wherein the ~~baffler~~ <u>barrier</u> layer comprises a material selected from the group consisting of Ti, V, Cr, Nb, Zr, Hf, Ta, Mo and W.--

Signed and Sealed this
Fifteenth Day of March, 2011

David J. Kappos
*Director of the United States Patent and Trademark Office*

CERTIFICATE OF CORRECTION (continued)
U.S. Pat. No. 7,598,529 B2

Column 9, lines 31-32, should read as follows:

--19. The process as claimed in claim 15, wherein the ~~baffler~~ <u>barrier</u> layer has a thickness between 5 nm and 100 nm inclusive.--